US008970203B2

(12) United States Patent
Idiart

(10) Patent No.: US 8,970,203 B2
(45) Date of Patent: Mar. 3, 2015

(54) FIELD DEVICE FOR PROCESS AUTOMATION

(75) Inventor: Marco Enrique Idiart, Bariloche (AR)

(73) Assignee: Siemens Aktiengesellschaft, Munich (DE)

( * ) Notice: Subject to any disclaimer, the term of this patent is extended or adjusted under 35 U.S.C. 154(b) by 975 days.

(21) Appl. No.: 13/127,025

(22) PCT Filed: Oct. 30, 2009

(86) PCT No.: PCT/EP2009/064335
§ 371 (c)(1),
(2), (4) Date: Dec. 5, 2011

(87) PCT Pub. No.: WO2010/049513
PCT Pub. Date: May 6, 2010

(65) Prior Publication Data
US 2012/0086474 A1 Apr. 12, 2012

(30) Foreign Application Priority Data
Oct. 30, 2008 (DE) .......................... 10 2008 054 053

(51) Int. Cl.
*H03M 1/10* (2006.01)
*H03M 1/82* (2006.01)

(52) U.S. Cl.
CPC ............ *H03M 1/1071* (2013.01); *H03M 1/822* (2013.01)
USPC .......................................... 324/76.44; 327/70

(58) Field of Classification Search
CPC ............................. H03M 1/1071; H03M 1/822
USPC .......................................... 324/76.44; 327/70
See application file for complete search history.

(56) References Cited

U.S. PATENT DOCUMENTS

| 5,050,151 A * | 9/1991 | Kurz ........................... 369/44.29 |
| 6,462,692 B1 | 10/2002 | Moriya |
| 6,741,533 B1 | 5/2004 | Hiratsuka et al. |
| 7,219,023 B2 * | 5/2007 | Banke et al. .................... 702/58 |
| 7,439,698 B2 | 10/2008 | Ludwig et al. |
| 7,539,600 B2 | 5/2009 | Pfundlin et al. |
| 2002/0097035 A1 * | 7/2002 | Atallah et al. ............. 324/76.11 |
| 2008/0048628 A1 | 2/2008 | Lee |

FOREIGN PATENT DOCUMENTS

| CN | 1233112 | 10/1999 |
| CN | 1321304 | 11/2001 |
| CN | 101132148 | 2/2008 |
| DE | 10 2005 018 398 | 10/2006 |

(Continued)

*Primary Examiner* — Jeff Natalini
(74) *Attorney, Agent, or Firm* — Cozen O'Connor

(57) ABSTRACT

A field device comprising a signal processing unit that generates a digital measurement, control or regulation signal, and comprises an output stage that converts the digital measurement, control or regulation signal into an analog voltage or current signal, The field device also includes a monitoring device which comprises a measuring device that detects the analog voltage or current signal and converts this signal into a digital voltage or current measurement signal, a first digital low-pass filter for filtering the digital measurement, control or regulation signal, a second digital low-pass filter having the same cut-off frequency as that of the first digital low-pass filter, a comparator downstream of the low-pass filters, and an evaluation device that generates an error message when the deviation between the compared signals exceeds a pre-determined level.

10 Claims, 2 Drawing Sheets

(56) References Cited

FOREIGN PATENT DOCUMENTS

| | | |
|---|---|---|
| EP | 1 684 408 | 7/2006 |
| JP | 1138478 | 5/1989 |
| WO | WO 03/060851 | 7/2003 |

\* cited by examiner

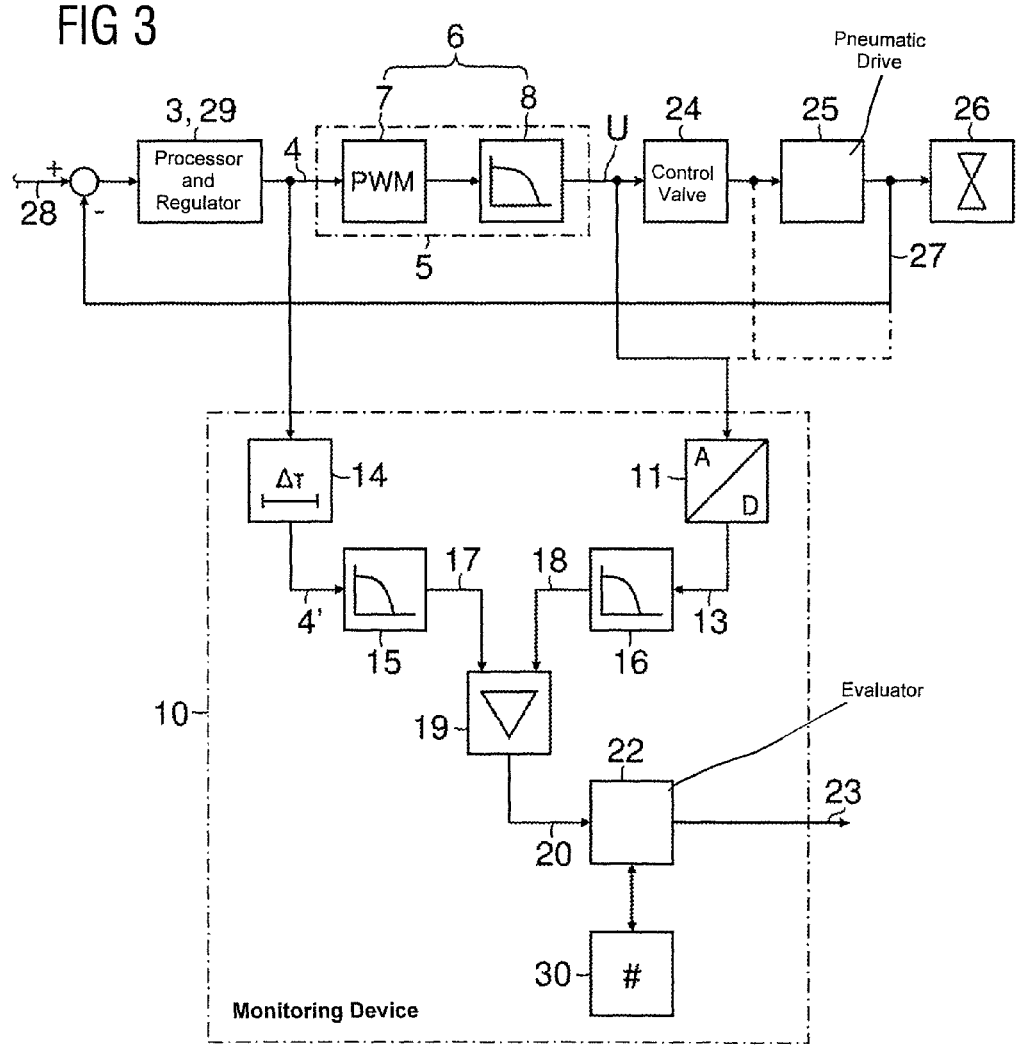

FIELD DEVICE FOR PROCESS AUTOMATION

CROSS-REFERENCE TO RELATED APPLICATIONS

This is a U.S. national stage of application No. PCT/EP2009/064335 filed 30 Oct. 2009. Priority is claimed on German Application No. 10 2008 054 053.6 filed 30 Oct. 2008, the content of which is incorporated herein by reference in its entirety.

BACKGROUND OF THE INVENTION

1. Field of the Invention

The present invention relates to process automation and, more particularly, to a field device for process automation.

2. Description of the Related Art

In field devices, a digital measurement, control or regulation signal is often generated by digital signal processing, and is then converted into a corresponding low-frequency analog voltage or current signal.

One example of this is a regulating or actuating device in which a signal processing device (e.g., a digital regulator) generates a digital control or regulation signal that is then converted, by an output stage, into an analog voltage or current signal for driving an actuator such as a valve.

Another example is a measuring transducer that is used to detect a physical variable, such as temperature, and to convert the variable into an output signal that is transmitted to a device, such as a control or regulating device. Here, a sensor that detects the physical variable provides an electrical raw signal that is generally analog. The output signal from the measuring transducer may be digital or analog, where the output signal is a current signal, usually in the range of 4 to 20 mA, in the latter case considered here. A higher-frequency digital signal in the kHz range can be superimposed on the analog current signal which, at up to approximately 100 Hz, is a low-frequency signal, according to the HART specification. In this case, the raw signal provided by the sensor is processed to form a digital measurement signal using a signal processing device, where the signal processing generally comprises analog signal processing steps, such as analog filtering and pre-amplification, as well as digital signal processing steps, such as zero point determination, scaling (i.e., determination of the measurement range) and signal conditioning using a specific transfer function. The digital measurement signal is then converted into the desired analog current signal using an output stage. Here, the digital measurement, control or regulation signal must be previously converted into an analog signal to generate the analog voltage or current signal. This may be effected, for example, by pulse width modulation (PWM) and downstream analog filtering, as is known from DE 10 2005 018 398 A1.

It is a known practice to perform signal processing in a redundant or diverse manner and to check the signal processing results for a match to detect errors during signal processing. It is also a known practice to "back-calculate" the result of a signal processing algorithm and to compare the back-calculated result with the input signal.

WO 03/060851 A1 discloses a measuring transducer in which an auxiliary signal is formed in a monitoring device from the raw signal provided by a sensor after passing through signal preprocessing, where the auxiliary signal is compared with the output signal, for example, a 4 to 20 mA current signal, from the measuring transducer to trigger an error message in the event of a difference that exceeds a predefined amount and to set the output signal in a safety-oriented manner. In order The raw signal is processed in a further microprocessor, which is provided in addition to the signal processing microprocessor, with the signal processing transfer function to form the auxiliary signal.

The conversion of the digital measurement signal generated by the signal processing device into the analog output signal is influenced by the dynamic response of the output stage, for example, a signal delay caused by the time constant of the output stage, which makes it difficult to compare signals and may result in undesirable error messages.

SUMMARY OF THE INVENTION

It is therefore an object of the invention to provide a field device for process automation that avoids the disadvantages associated with known field devices.

This and other objects and advantages are achieved in accordance with the invention by providing a field device for process automation, having a signal processing device that generates a digital measurement, control or regulation signal, an output stage that converts the digital measurement, control or regulation signal into a corresponding low-frequency analog voltage or current signal, and a monitoring device comprising a measuring device which detects the analog voltage or current signal and converts it into a digital voltage or current measurement signal, a first digital low-pass filter for filtering the digital measurement, control or regulation signal, where the cut-off frequency of the low-pass filter is lower than the cut-off frequency of the output stage, a second digital low-pass filter having the same cut-off frequency as that of the first digital low-pass filter for filtering the digital voltage or current measurement signal, comparator which is downstream of the low-pass filters and compares the low-pass-filtered digital measurement, control or regulation signal and the low-pass-filtered digital voltage or current measurement signal with one another, and an evaluation device which is downstream of the comparator and generates an error message if the difference between the two compared signals exceeds a predefined amount.

In the field device in accordance with the invention, the conversion of the digital measurement, control or regulation signal into the corresponding analog voltage or current signal is monitored. As a result of the fact that the digital measurement, control or regulation signal and the detected voltage or current signal converted into a digital voltage or current measurement signal are each subjected to low-pass filtering before the comparison, the dynamic response of the output stage above the cut-off frequency of the low-pass filters remains unconsidered during the comparison and cannot result in undesirable error messages.

In an advantageous embodiment, an output stage of the field device comprises a pulse width modulator followed by an analog low-pass filter and, optionally, a voltage/current converter downstream of the analog low-pass filter.

Here, the cut-off frequency of the two digital low-pass filters is preferably a multiple, for example, approximately 10 times, lower than the cut-off frequency of the output stage. However, the problem of interference that arises within the useful frequency range of the voltage or current signal above the cut-off frequency of the low-pass filters remaining undetected may arise in this case. In order to prevent this problem, the cut-off frequency of the output stage is a multiple higher than the cut-off frequency of the low-frequency voltage or current signal, with the result that the cut-off frequency of the low-pass filters is established in the vicinity of the upper cut-off frequency of the voltage or current signal.

The low-pass-filtered signals supplied to the comparator may have a time delay caused by the different signal paths of the digital measurement, control or regulation signal from the output of the signal processing device to the inputs of the comparator. A delay stage that delays the digital measurement, control or regulation signal supplied to the first digital low-pass filter is preferably upstream of the digital low-pass filter to avoid undesirable error messages resulting from this time delay, where the delay of the delay stage corresponds to the signal delay from the output of the signal processing device to the output of the measuring device.

In an embodiment, a third low-pass filter is preferably inserted between the comparator and the evaluation device to prevent undesirable error messages due to brief interference signals, such as interference pulses.

In an alternative embodiment, a counter is assigned to the evaluation device, where the evaluation device generates an error message if the frequency of the differences between the two compared signals, which exceed the predefined amount, exceeds a predefined number.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In order to explain the invention further, reference is made to the figures of the drawing below, in which:

FIG. 3 shows a simplified block diagram of another exemplary embodiment of the field device comprising a regulating device in accordance with the invention.

DETAILED DESCRIPTION OF THE INVENTION

Figure 1:
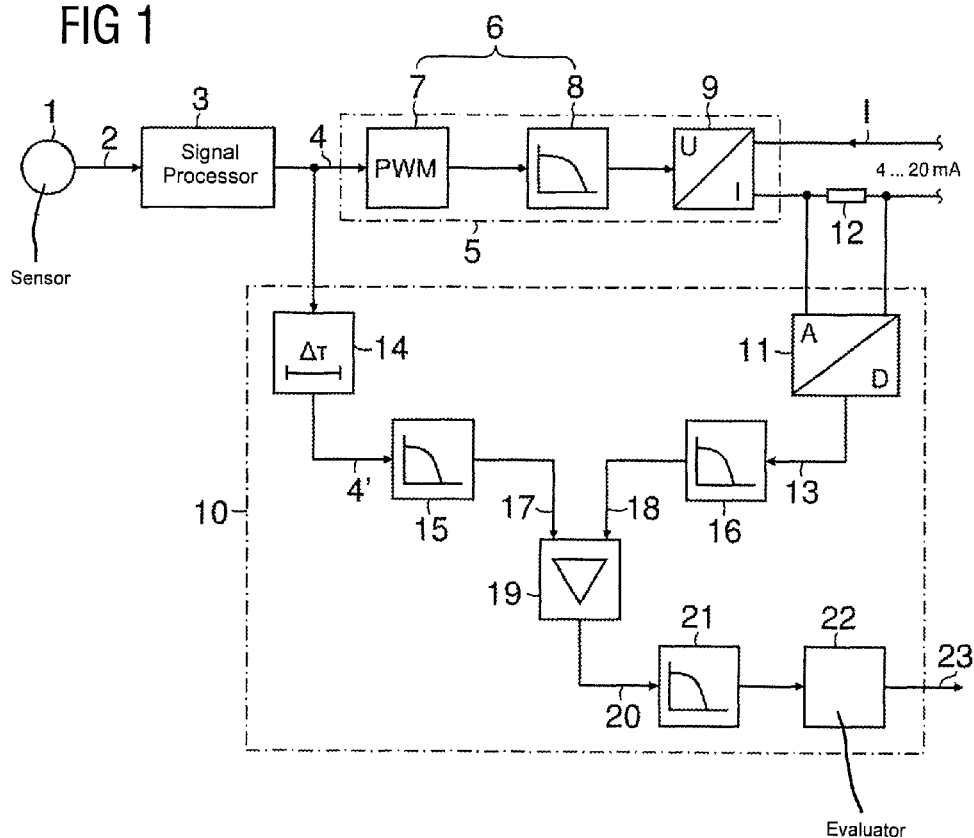
FIG. 1 shows a simplified block diagram of an exemplary embodiment of the field device comprising a measuring transducer in accordance with the invention.

FIG. 1 shows a measuring transducer having a sensor 1 which detects a physical variable, for example, temperature, and converts the detected physical variable into an analog raw signal 2. The analog raw signal 2 is supplied to a signal processing device 3 in which analog signal pre-processing, analog/digital conversion and finally digital processing of the raw signal 2 to form a digital measurement signal 4 are performed. The measurement signal 4 is converted into an analog 4 to 20 mA current signal I in an output stage 5. For this purpose, the output stage 5 contains a digital/analog converter 6 consisting of a pulse width modulator 7, with a downstream analog low-pass filter 8, and a voltage/current converter 9.

A monitoring device 10, which is supplied with the two signals 4 and I, is provided to monitor the conversion of the digital measurement signal 4 into the corresponding analog current signal I. If the corresponding devices are present, the output signal 6 can be directly acquired from the voltage/current converter 9 or, as shown here, can be detected as a voltage drop across a current measuring resistor 12 using a measuring device 11 and can be converted into a digital current measurement signal 13. The digital measurement signal 4 is supplied to a delay stage 14, the delay of which corresponds approximately to the delay of the measurement signal 4 on the path from the input of the output stage 5 to the output of the measuring device 11. The delayed measurement signal 4' and the digital current measurement signal 13 are respectively supplied to a first first-order low-pass filter 15 and a second first-order low-pass filter 16, the cut-off frequency of which is lower than the cut-off frequency of the output stage 5. The low-pass-filtered digital measurement signal 17 and the low-pass-filtered digital current measurement signal 18 are compared with one another in a comparator 19. The comparator 19 generates a comparison signal 20 which corresponds to the difference between the two signals 17 and 18 and is supplied, via a further low-pass filter 21, to an evaluation device 22 that generates an error message 23 if the difference between the two compared signals 17 and 18 exceeds a predefined amount.

Figure 2:
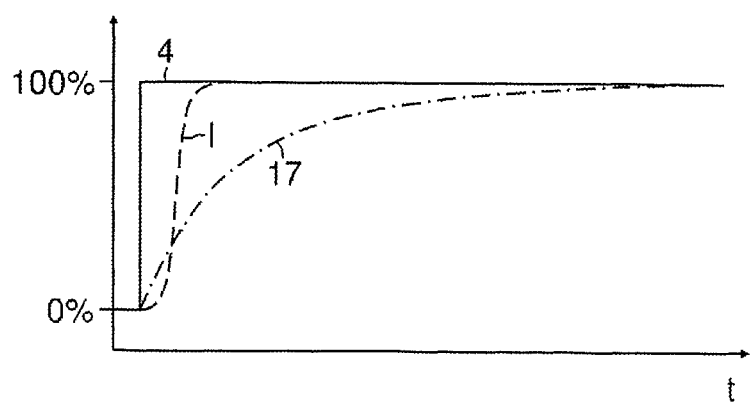
FIG. 2 shows is an exemplary graphical plot of a temporal profile of a digital measurement signal, analog current signal and low-pass-filtered measurement signal in accordance with the invention.

FIG. 2 shows an exemplary graphical plot of the temporal profile of the digital measurement signal 4, the analog current signal I and the low-pass-filtered measurement signal 17 which is undelayed. The digital measurement signal 4 has, as the desired signal, a profile from 0 to 100% which is abrupt, for example, in this case, whereas the analog current signal I, as the actual signal, reaches the end value of 100% after a certain delay in a profile that is not abrupt when there are no errors. This delay is caused by the dynamic response of the output stage 5 and is dependent on frequency. Although the measurement signal 4 is thus converted into the current signal I without errors, the two signal profiles 4 and I differ from one another and cannot be readily compared with one another. As discernable using the profile of the low-pass-filtered measurement signal 17, the static aspects are provided with a higher weighting than the dynamic aspects by the low-pass filtering: both low-pass-filtered signals 17 and 18 asymptotically strive for the 100% value. With respect to the current signal I, this means that the dynamic response of the output stage 5 plays only a minor role in the low-pass-filtered digital current measurement signal 18. The digital measurement signal 4 is therefore subjected to low-pass filtering so that it experiences the same signal processing as the current signal I and can be compared with the current signal I. The pure delay in the output stage 5 is simulated by the delay stage 14.

At an upper cut-off frequency of the useful frequency range of the current signal I of 100 Hz, for example, the cut-off frequency of the output stage may be ≥100 Hz. The cut-off frequency of the low-pass filters 15 and 16 is established to a multiple lower than the cut-off frequency of the output stage 5 and is 10 Hz, for example. In accordance with the invention, the cut-off frequency of the output stage 5 is a multiple higher than the cut-off frequency of the current signal I and is 1000 Hz, for example. As a result, interference that occurs within the useful frequency range of the current signal I above the cut-off frequency of the low-pass filters 15 and 16, i.e., in the range of 10 to 100 Hz, does not remain undetected.

FIG. 3 shows a regulating device, for example, an electropneumatic position regulator (i.e., positioner), which operates a pneumatic drive 25 for a process valve 26 using an electrically controllable control valve 24 to move the process valve 26 into a predefined valve position. The actual valve position 27 is detected and is provided, together with a desired valve position 28, to a signal processing device 3 that includes a digital regulator 29 in the case and generates a digital regulation signal 4. In an output stage 5, the regulation signal 4 is converted into an analog voltage signal U for controlling the control valve 24. For this purpose, the output stage 5 contains a digital/analog converter 6 consisting of a pulse width modulator 7 with a downstream analog low-pass filter 8. A monitoring device 10 is provided for monitoring the conversion of the digital regulation signal 4 into the corresponding analog voltage signal U, where the monitoring device is supplied with the two signals 4 and U and is largely constructed and operates in exactly the same manner as described above using FIG. 1. The only difference here is that a counter 30 is assigned to the evaluation device 22 as an alternative to the further low-pass filter 21, where the evaluation device 22 generates an error message 23 if the frequency of the differences between the two compared signals 17 and 18, which exceed the predefined amount, exceeds a predefined number. In addition, as indicated using dashed lines, the pneumatic signal at the output of the control valve 24 or the actual valve position 27 can be supplied to the monitoring device 10 instead of the voltage signal U.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention.

The invention claimed is:

1. A field device for process automation, comprising:
    a signal processing device configured to generate a digital measurement, control or regulation signal;
    an output stage configured to convert the digital measurement, control or regulation signal into a corresponding low-frequency analog voltage or current signal; and
    a monitoring device comprising:
        a measuring device configured to detect and convert the analog voltage or current signal into a digital voltage or current measurement signal;
        a first digital low-pass filter configured to filter the digital measurement, control or regulation signal, a cut-off frequency of the low-pass filter being lower than the cut-off frequency of the output stage;
        a second digital low-pass filter having a same cut-off frequency as the first digital low-pass filter and configured to filter the digital voltage or current measurement signal;
        a comparator arranged downstream of the low-pass filters and configured to compare the low-pass-filtered digital measurement, control or regulation signal and the low-pass-filtered digital voltage or current measurement signal with one another; and
        an evaluation device arranged downstream of the comparator and configured to generate an error message if a difference between the low-pass-filtered digital measurement, control or regulation signal and the low-pass-filtered digital voltage or current measurement signal exceeds a predefined amount.

2. The field device as claimed in claim 1, wherein the output stage comprises a pulse width modulator followed by an analog low-pass filter to provide the low-frequency analog voltage signal.

3. The field device as claimed in claim 1, wherein the output stage comprises a pulse width modulator followed by an analog low-pass filter and a voltage/current converter arranged downstream of the analog low-pass filter to provide the analog current signal.

4. The field device as claimed in claim 3, wherein the cut-off frequency of the output stage is a multiple higher than an upper frequency of a useful frequency range of the low-frequency voltage or current signal.

5. The field device as claimed in claim 1, wherein the cut-off frequency of the first and second digital low-pass filters is a multiple lower than the cut-off frequency of the output stage.

6. The field device as claimed in claim 1, further comprising:
    a delay stage configured to delay the digital measurement, control or regulation signal supplied to the first digital low-pass filter and connected upstream of the first digital low-pass filter, a delay of the delay stage corresponding to a signal delay from an output of the signal processing device to the output of the measuring device.

7. The field device as claimed in claim 1, further comprising:
    a third low-pass filter connected between the comparator and the evaluation device.

8. The field device as claimed in claim 1, further comprising:
    a counter assigned to the evaluation device, the evaluation device generating an error message if a frequency of differences between the low-pass-filtered digital measurement, control or regulation signal and the low-pass-filtered digital voltage or current measurement signal, which exceed the predefined amount, exceeds a predefined number.

9. The field defined as claimed in claim 1, further comprising:
    a measuring transducer having a sensor configured to detect a physical variable and converts it into an electrical raw signal;
    wherein the signal processing device converts the electrical raw signal into the digital measurement, control or regulation signal; and
    wherein the output stage emits a low-frequency analog current signal corresponding to the digital measurement, control or regulation signal.

10. The field device as claimed in claim 1, further comprising:
    a regulating or actuating device in which the signal processing device generates the digital control or regulation signal, and in which the output stage controls at least one actuator using the low-frequency analog voltage or current signal.

* * * * *